United States Patent
Kampen et al.

(10) Patent No.: US 8,513,714 B2
(45) Date of Patent: Aug. 20, 2013

(54) ELECTRIC CONTACTING OF SEMICONDUCTOR COMPONENTS HAVING LOW CONTACT RESISTANCE

(75) Inventors: Christian Kampen, Erlangen (DE); Alexander Burenkov, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 164 days.

(21) Appl. No.: 12/863,496

(22) PCT Filed: Feb. 26, 2008

(86) PCT No.: PCT/DE2008/000331
§ 371 (c)(1),
(2), (4) Date: Sep. 16, 2010

(87) PCT Pub. No.: WO2009/089806
PCT Pub. Date: Jul. 23, 2009

(65) Prior Publication Data
US 2011/0284933 A1    Nov. 24, 2011

(30) Foreign Application Priority Data
Jan. 17, 2008   (DE) .......................... 10 2008 005 016

(51) Int. Cl.
*H01L 29/76*  (2006.01)
(52) U.S. Cl.
USPC ............ 257/288; 257/E29.242; 257/E21.296; 438/682
(58) Field of Classification Search
USPC ............. 257/288, E29.242, E21.296, E21.09; 438/682
See application file for complete search history.

(56) References Cited

U.S. PATENT DOCUMENTS

| | | | |
|---|---|---|---|
| 4,072,545 A | 2/1978 | De La Moneda | |
| 6,441,435 B1 | 8/2002 | Chan | |
| 6,593,217 B1 | 7/2003 | Fujisawa | |
| 2003/0006462 A1 | 1/2003 | Quek et al. | |
| 2003/0148563 A1 | 8/2003 | Nishiyama | |
| 2004/0129981 A1 | 7/2004 | Kim et al. | |
| 2005/0121710 A1* | 6/2005 | Shino ........................... | 257/296 |

FOREIGN PATENT DOCUMENTS
JP    07 183486    7/1995

OTHER PUBLICATIONS

International Search Report From PCT/DE2008/000331 Dated Oct. 1, 2008 With an English Translation.
Kedzierski, Jakub, et al., "Issues in NiSi-gated FDSOI device integration," Electron Devices Meeting, 2003, IEDM '03 Technical Digest, *IEEE International*, pp. 18.4.1-18.4.4 Conference Publications.

* cited by examiner

*Primary Examiner* — Eugene Lee
*Assistant Examiner* — Elias M Ullah
(74) *Attorney, Agent, or Firm* — Venable LLP; Robert Kinberg; Thomas A. Negley

(57) ABSTRACT

The present invention relates to a semiconductor component which comprises at least one electric contact surface for the electric contacting of a semiconductor region (1) with a metal material (3). To this end, the electric contact surface is configured by a surface of a semiconductor layer that is structured in terms of the depth thereof and preferably silicidated. By configuring a three-dimensional surface topography of the semiconductor layer, an enlargement of the electric contact surface is achieved, without enlarging the surface required for the semiconductor component and without the use of additional materials. In this way, the invention can advantageously be used to reduce parasitic contact resistance in semiconductor components which are produced using standard CMOS processes.

4 Claims, 4 Drawing Sheets

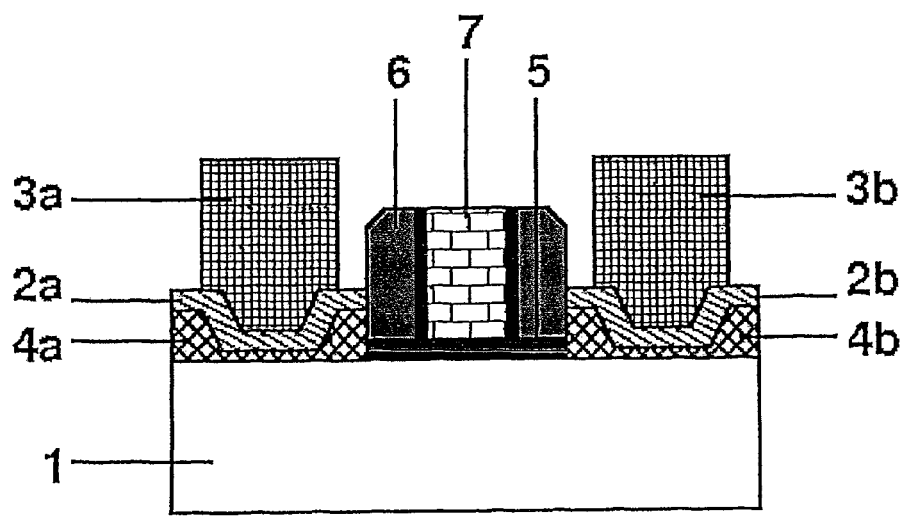
Fig. 1
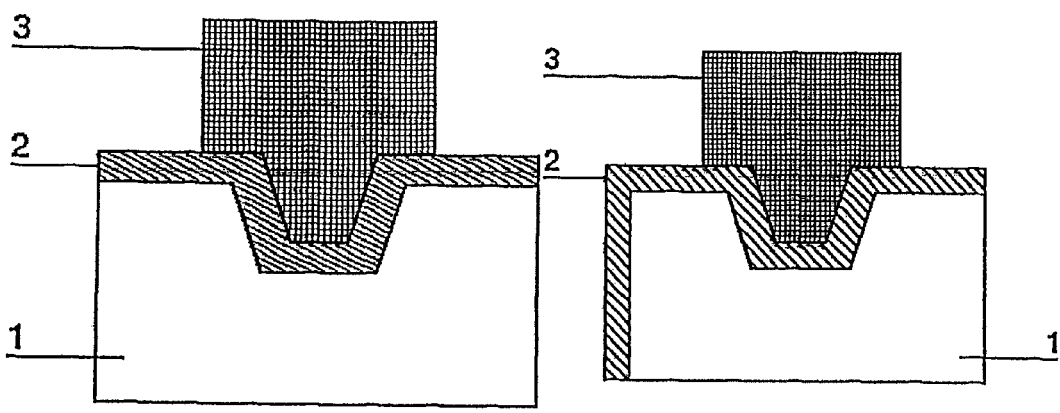
Fig. 2
Fig. 3

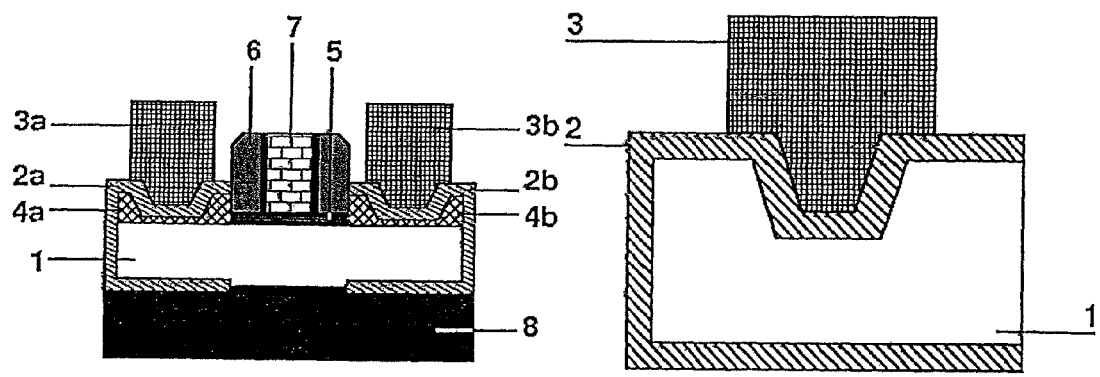
Fig. 4
Fig. 5
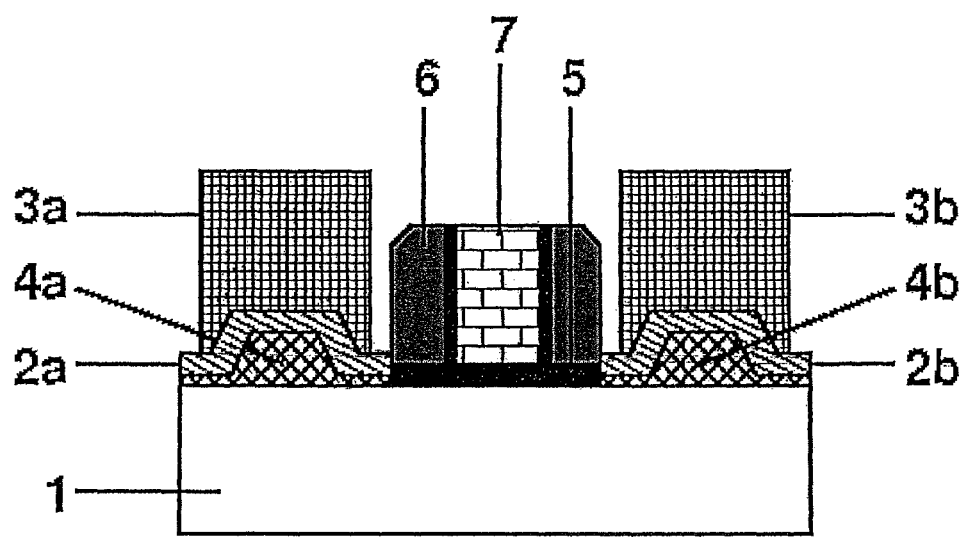
Fig. 6

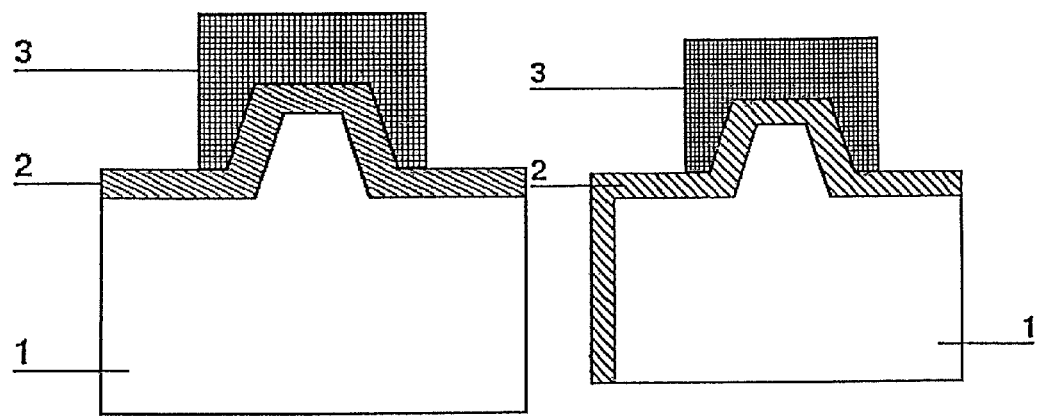
Fig. 7
Fig. 8
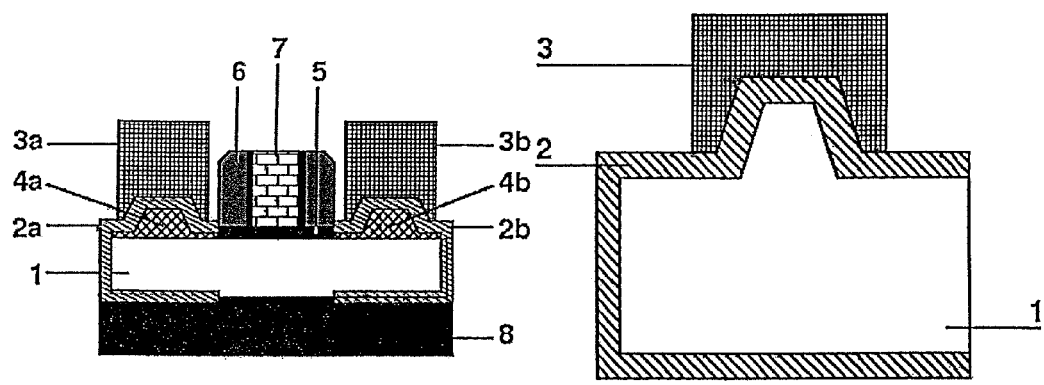
Fig. 9
Fig. 10

ELECTRIC CONTACTING OF SEMICONDUCTOR COMPONENTS HAVING LOW CONTACT RESISTANCE

CROSS-REFERENCE TO RELATED APPLICATIONS

This application is a National Stage Application of PCT/DE2008/000331, filed Feb. 26, 2008, which designates the United States and claims the priority of German Patent Application 10 2008 005 016.4, filed Jan. 17, 2008.

FIELD OF THE INVENTION

The present invention relates to a semiconductor component which comprises at least one electric contact surface for establishing an electric contact between a semiconductor region and a metal material, and a method for producing the electric contact surface. The electric contact surfaces can involve, for example, drain and source terminals of transistors, in particular of decanano MOSFETs.

BACKGROUND

Due to the aggressive scaling of CMOS components in the past years, parasitic resistances at the source and drain terminals of transistors have become an increasing problem. For reducing said parasitic resistances it is known to silicidate the electric contact surfaces in order to be able to use the entire surface of the semiconductor region to be contacted, e.g., the active source and drain region, as contact surface. As an example of the prior art, reference is made to J. Kedzierski et al., "Issues in NiSi-gated FDSOI device integration," in IEDM Tech. Dig. 2003, who carry out such a silicidation of the source and drain contact surfaces.

The contact resistances of a silicidated electric contact surface between a semiconductor region and a metallic terminal element follow the equation:

$$R_{co} = \frac{\rho_c}{W \cdot l_c}$$

$P_c$ represents the specific contact resistance between the metal surface and the silicon therebelow. W indicates the width of the contact and $l_c$ the contact length which, in the case of a transistor, corresponds to the expansion of the contact surface in channel direction of the transistor. The contact length $l_c$ has become a critical factor since the transistors have been scaled in the nanometer range. In addition, the specific contact resistance $P_c$ depends on the surface doping concentration $N_d$ and the Schottky barrier $\Phi_B$ of the used metal or silicides.

$$\rho_c \propto \exp\left(\frac{4\pi\Phi_B}{qh}\sqrt{\frac{m^*\varepsilon_{Si}}{N_d}}\right)$$

Wherein q denotes the elementary charge of an electron, m* the effective mass, $\varepsilon_{Si}$ the dielectric constant of silicon, and h the Planck's constant. For further minimizing the contact resistances, experiments with alternative surface doping substances such as, e.g. sulfur, are currently carried out in order to reduce the specific contact resistance of the metal-silicon interface.

However, the introduction of new materials in a CMOS process involves considerable efforts and costs because the process normally becomes more complicated.

SUMMARY OF THE INVENTION

The object of the present invention is to provide a configuration of an electric contact surface in a semiconductor component and a method for the production of the contact surface by means of which a reduced parasitic resistance with cost-efficient productibility is achieved.

According to one embodiment, the proposed semiconductor component which has at least one electric contact surface for establishing an electric contact between a semiconductor region and a metallic material or a metallic element is characterized in that the contact surface is formed by a preferably silicidated surface of a semiconductor layer which is structured in terms of the depth thereof.

The basic idea of the present invention is to enlarge the electric contact surface without enlarging the required surface for the component. The enlargement of the contact surface is achieved by structuring a semiconductor layer of the semiconductor region to be contacted or of a semiconductor material applied thereon in terms of the depth in such a manner that a three-dimensional surface topography is obtained. By means of said surface topography and with the same lateral expansion of the contact surface, an enlargement of the surface and thus a reduction of the contact resistance is achieved. Preferably, a continuous silicidation of said surface takes place, wherein, of course, other techniques for reducing the contact resistance can also be used.

Here, an enlargement of the contact surface can be implemented by incorporating indentations such as, e.g., trenches, or by generating elevations, and can be carried out in an advantageous manner with a standard CMOS process. In one method variant, for this purpose, a selective epitaxial layer (SEG) is grown on the semiconductor region to be contacted and is doped to generate the desired electric conductivity. The epitaxial growth of SEG layers is already known, e.g., from the production of SOI components (SOI: Silicon on insulator). For subsequently enlarging the contact surface, a lithography step and an etching step are carried out after generating and doping the SEG layer so as to obtain the desired three-dimensional surface topography. For this, for example, suitable trenches can be etched into the SEG layer. After generation of the surface topography, as usual, a metal suitable for silicidation such as, e.g., nickel or cobalt is deposited on the structured surface to subsequently generate a silicide layer for the electric contact surface by means of a high temperature step.

In another configuration, with sufficient thickness of the semiconductor region to be contacted, said semiconductor region can be structured and silicidated directly in the above mentioned manner without prior application of a SEG layer.

By means of the proposed configuration of the electric contact surface, e.g., the parasitic contact resistances of source and drain contacts can be reduced at least by a factor ⅔. Thus, the invention is of advantage primarily for decanano-scaled CMOS components, the source and drain contact length of which are in the sub-100 nm range. The reduction of the parasitic contact resistances, which are currently in the range between 500 and 200 Ωμm, by a factor ⅔ has a direct effect on the total resistance of the component and thus on the on-current. Thus, a higher switching speed of the component is achieved because the on-current of the component is directly influenced by the parasitic contact resistances.

With the above mentioned reduction of the parasitic contact resistances, the on-current increases by a factor 1.5. This is equal to a reduction of the switching delay by a factor ⅔, which is calculated by multiplying the component capacitances C by the operating voltage $V_{DD}$ and by dividing by the on-current $I_{on}$ ($t=CV_{DD}/I_{on}$) Accordingly, the CMOS component switches 1.5 times faster. This advantage is achieved in the present invention by an enlargement of the contact surface by means of a three-dimensional structuring so that no additional surface of the CMOS component is required. The production of an electric contact surface configured according to the invention can be integrated in a standard CMOS process without the use of additional materials.

The main application area of the present invention is in the field of microelectronics, in particular for integrated circuits. Such electric contact surfaces can be used in a particularly advantageous manner for transistors which have structures in the sub-100 nm range. Of course, the invention can also be used for other semiconductor-based components which have a metallic semiconductor interface as contact such as, e.g. Schottky diodes.

BRIEF DESCRIPTION OF THE DRAWINGS

The proposed semiconductor component and the associated method are described again hereinafter in more detail by means of exemplary embodiments in connection with the drawings. In the figures, illustrated schematically:

FIG. 1 shows an example for a MOSFET component with contact surfaces configured according to the invention;

FIG. 2 shows an example for a contact surface configured according to the invention;

FIG. 3 shows a further example for a contact surface configured according to the invention;

FIG. 4 shows a SOI MOSFET component with contact surfaces configured according to the invention;

FIG. 5 shows a further example for a contact surface configured according to the invention;

FIG. 6 shows a MOSFET component with contact surfaces configured according to the invention;

FIG. 7 shows a further example for a contact surface configured according to the invention;

FIG. 8 shows a further example for a contact surface configured according to the invention;

FIG. 9 shows an example for a SOI MOSFET component with contact surface configured according to the invention;

FIG. 10 shows a further example for a contact surface configured according to the invention.

DETAILED DESCRIPTION OF THE EMBODIMENTS

Figure 11:
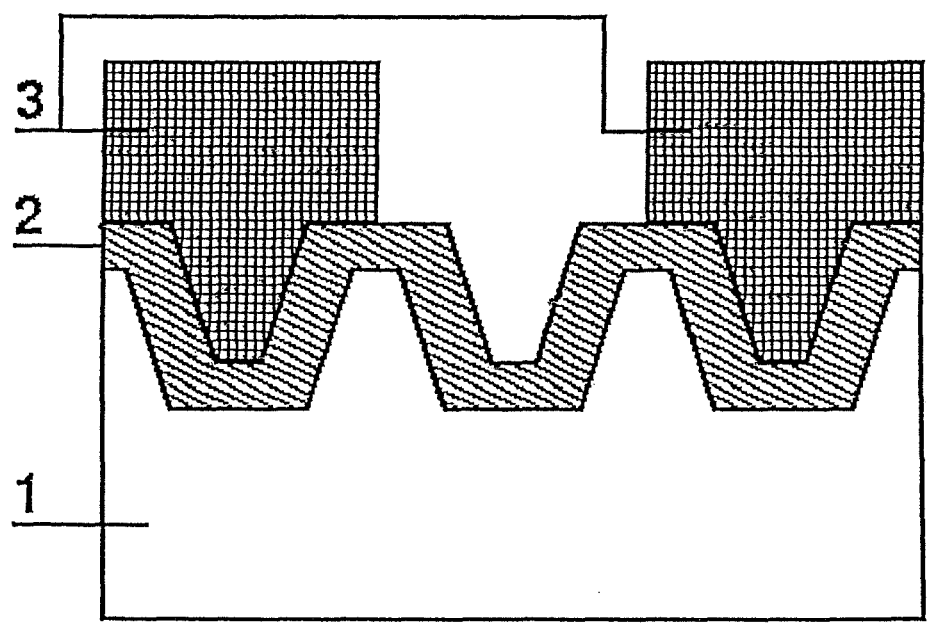
FIG. 11 shows a further example for a contact surface configured according to the invention.

FIG. 1 shows in a schematic illustration a MOSFET transistor in which the source and drain contact surfaces are configured according to the invention. The figure shows the silicon substrate 1 with the source and drain semiconductor regions which are not characterized in more detail. Besides the gate and spacer oxide 5, the nitride spacers 6, and the conventional polysilicon gate 7, a SEG layer 4a, 4b has been applied onto said substrate. The SEG layer 4a, 4b has been structured by generating trenches perpendicular to the channel direction of the MOSFET by means of a lithography step and an etching step, as is apparent from FIG. 1. Generating and doping the SEG layers 4a, 4b and the polysilicon gate 7 with the gate and spacer oxide 5 and the nitride spacers 6 can take place in a known manner as it is known in the art for the production of MOSFET components. The same applies to the subsequent silicidation of the surface of the structured SEG layer 4a, 4b by applying a suitable metallic material and a subsequent high temperature step. In this manner, the illustrated silicide layers 2a, 2b are obtained onto which subsequently the metal bodies 3a, 3b are applied which connect the component with the conductors. By the three-dimensional structuring of the SEG layer 4a, 4b, an enlargement of the surface of said layer and thus an enlargement of the electric contact surface is achieved, which results in a reduction of the contact resistance.

FIG. 2 shows again the principle of said enlargement of the contact surface by forming a trench, in this example in the silicon substrate 1. Here too, a subsequent silicidation of the structured surface for forming the silicide layer 2 takes place. By generating a trench with a suitable depth, the contact surface can at least be doubled so that a reduction of the contact resistance by half is achieved.

To further enlarge the contact surface, in addition, the lateral surfaces of the respective area can be silicidated by etching out the so-called shallow trench isolations (STI), which are conventionally used on a wafer between the components, filling them with a metal suitable for silicidating and subsequently silicidating them as well. The excess of non-silicidated metal can be removed afterwards to fill the STI again with silicon dioxide and to establish the isolation again between the components. To avoid shorts between the components arranged next to one another on a wafer, the oxide of the STI should not be removed completely so that the bottom of the isolation trench does not get silicidated. In this connection, FIG. 3 shows the semiconductor region to be contacted of the silicon substrate 1 with the surface structured and silicidated in terms of the depth and the silicidated lateral surface by means of which a continuous silicide layer 2 is formed. The metallic body 3 used for contacting is designated in this figure and in each of the following figures with the reference numbers 3, 3a, or 3b.

For SOI MOSFETs there is the additional possibility to add a buried contact as this is illustrated in the FIGS. 4 and 5. FIG. 4 shows in addition the buried oxide 8 of the SOI substrate onto which the silicon substrate 1 with the semiconductor regions to be contacted is applied. In the configuration illustrated in the FIGS. 4 and 5, the lower contacts of the transistor are etched into the oxide 8 prior to generating the SOI layers, filled with metal, and subsequently, the silicon substrate 1 for the transistors is bonded thereon. The further steps can be performed in the same manner as already explained by means of the FIGS. 1 to 3. Also in the example of the FIGS. 4 and 5, a lateral silicidation was carried out, in the same manner as in FIG. 3, so that after the high temperature step required for the silicidation, in which also the buried metal is silicidated, the continuous silicide layer 2 or 2a and 2b illustrated in the FIGS. 4 and 5 is obtained.

Alternatively to generating a trench in the SEG layer 4a, 4b or the silicon substrate 1, the surface of the SEG layer 4a, 4b or the silicon substrate 1 can also be generated by generating elevations, e.g. in the form of a contact pin, by means of a lithography step and a subsequent etching step. This is illustrated by means of the following FIGS. 6 to 10.

FIG. 6 shows in this connection a MOSFET component in a schematic illustration in which the SEG layer 4a, 4b is structured for forming such an elevation. The same reference numbers designate the same elements of said component which were already illustrated in connection with FIG. 1. Here too, a subsequent silicidation of the structured surface for forming the silicide layers 2a and 2b takes place. By the generation of elevations, the same surface increase can be achieved as by the generation of the trenches of FIGS. 1 to 5.

FIG. 7 shows again the principle in a schematic illustration. Besides the silicidation of the upper side of the area to be contacted, here too, in the same manner as in FIG. 2, also the side of the respective area can be silicidated so that the continuous silicide layer 2 shown in FIG. 8 is formed. By said lateral silicidation, the contact surface is enlarged additionally.

Furthermore, here too, a buried contact between the oxide 8 and the silicone substrate 1 can be generated for a SOI MOSFET component, which contact further enlarges the silicated surface and thus the contact surface of the respective semiconductor area. This is illustrated in the FIGS. 9 and 10 and has already been explained in connection with the FIGS. 4 and 5.

A further possibility for enlarging the contacting surface is the so-called comb structure of the contacts which can be applied to the width of the component, i.e., perpendicular to the channel direction in a transistor. For this purpose, as schematically illustrated in FIG. 11, a plurality of trenches or pins are generated in the direction perpendicular to the channel direction to elevate the contact surface. Here, there is also the possibility to place a plurality of parallelly connected metallic contact bodies 3 onto said contact surface. Of course, depending on the capabilities of the lithography and etching techniques, such comb structures can also be generated in the direction parallel to the channel direction.

The invention claimed is:

1. A semiconductor component which forms at least one transistor having a drain area and a source area, the semiconductor component including:
   a semiconductor layer presenting at least two electric contact surfaces to establish, respectively, an electric contact between the drain area and a first metallic body, and between the source area and a second metallic body, wherein the contact surfaces of the drain and source areas of the semiconductor layer each have a structured depth, so that each of the contact surfaces has lateral boundary surfaces inclined relative to the semiconductor layer, and wherein each contact surface, including the lateral boundary surfaces, is covered with a continuous silicide layer.

2. The semiconductor component according to claim 1, wherein the semiconductor layer comprises a selective epitaxial layer (SEG) which is doped and applied onto the drain and source areas to be contacted.

3. The semiconductor component according to claim 1, wherein each contact surface has a lower boundary surface, the lower boundary surface of each contact surface and the lateral boundary surfaces thereof being covered with a continuous silicide layer.

4. The semiconductor component according to claim 1, wherein the contact surfaces comprise a comb structure.

* * * * *

UNITED STATES PATENT AND TRADEMARK OFFICE
CERTIFICATE OF CORRECTION

PATENT NO. : 8,513,714 B2 Page 1 of 1
APPLICATION NO. : 12/863496
DATED : August 20, 2013
INVENTOR(S) : Kampen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 222 days.

Signed and Sealed this

Fifteenth Day of September, 2015

Michelle K. Lee
*Director of the United States Patent and Trademark Office*